United States Patent
Kim et al.

(10) Patent No.: US 7,616,053 B2
(45) Date of Patent: Nov. 10, 2009

(54) POWER AMPLIFIER CIRCUIT AND METHOD FOR ENVELOPE MODULATION OF HIGH FREQUENCY SIGNAL

(75) Inventors: Seung Woo Kim, Yongin-si (KR); Jeong Hoon Lee, Yongin-si (KR); Jae Sup Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 400 days.

(21) Appl. No.: 11/703,194

(22) Filed: Feb. 7, 2007

(65) Prior Publication Data
US 2008/0008273 A1    Jan. 10, 2008

(30) Foreign Application Priority Data
Jul. 7, 2006    (KR)    ...................... 10-2006-0063909

(51) Int. Cl.
*H03F 3/38*    (2006.01)
(52) U.S. Cl. .......................................... 330/10; 330/277
(58) Field of Classification Search .................. 330/10, 330/277, 276, 285, 296
See application file for complete search history.

(56) References Cited

U.S. PATENT DOCUMENTS

| 3,457,520 | A | * | 7/1969 | Townsend ................... 330/277 |
| 3,879,688 | A | * | 4/1975 | Hayashi et al. ............. 330/277 |
| 4,366,450 | A | * | 12/1982 | Suganuma ................... 330/285 |
| 4,774,477 | A | * | 9/1988 | Rodes et al. ................. 330/277 |
| 6,549,071 | B1 | * | 4/2003 | Paul et al. ................... 330/252 |
| 6,614,307 | B1 | | 9/2003 | Zhao et al. |
| 6,937,096 | B2 | | 8/2005 | Wight et al. |
| 2005/0077964 | A1 | | 4/2005 | Maeda |

FOREIGN PATENT DOCUMENTS

| JP | 09-130159 A | 5/1997 |
| JP | 2003-046345 A | 2/2003 |

* cited by examiner

*Primary Examiner*—Henry K Choe
(74) *Attorney, Agent, or Firm*—Sughrue Mion, PLLC

(57) ABSTRACT

A power amplifier circuit includes: a transformer receiving a first signal and generating a transformed signal from the first signal; and a transistor receiving a second signal having a direct current (DC) component, and generating an output signal. The second signal and the transformed signal are mixed, via a terminal connected with the transformed signal, wherein an envelope of the output signal is controlled by the first signal.

8 Claims, 7 Drawing Sheets

POWER AMPLIFIER CIRCUIT AND METHOD FOR ENVELOPE MODULATION OF HIGH FREQUENCY SIGNAL

CROSS-REFERENCE TO RELATED APPLICATION

This application claims the benefit of Korean Patent Application No. 10-2006-0063909, filed on Jul. 7, 2006, in the Korean Intellectual Property Office, the disclosure of which is incorporated herein by reference.

BACKGROUND OF THE INVENTION

1. Field of the Invention

Apparatuses and methods consistent with the present invention relate to a radio frequency transmitter, and more particularly, to a power amplifier circuit of a polar modulation system for envelope modulation of a high frequency signal.

2. Description of Related Art

In a transmitter of a system for high speed wireless communication such as a mobile phone, a digital multimedia broadcasting (DMB) phone, a personal digital assistant (PDA), and the like, various transmission schemes including an envelope modulation, for example, a quadrature phase shift keying (QPSK) modulation, a quadrature amplitude modulation (QAM), and the like, have been adopted. For the transmitter, a power amplifier is utilized to amplify a high frequency signal containing certain information. An output of the power amplifier is transmitted to a correspondent system via an antenna.

Figure 1:
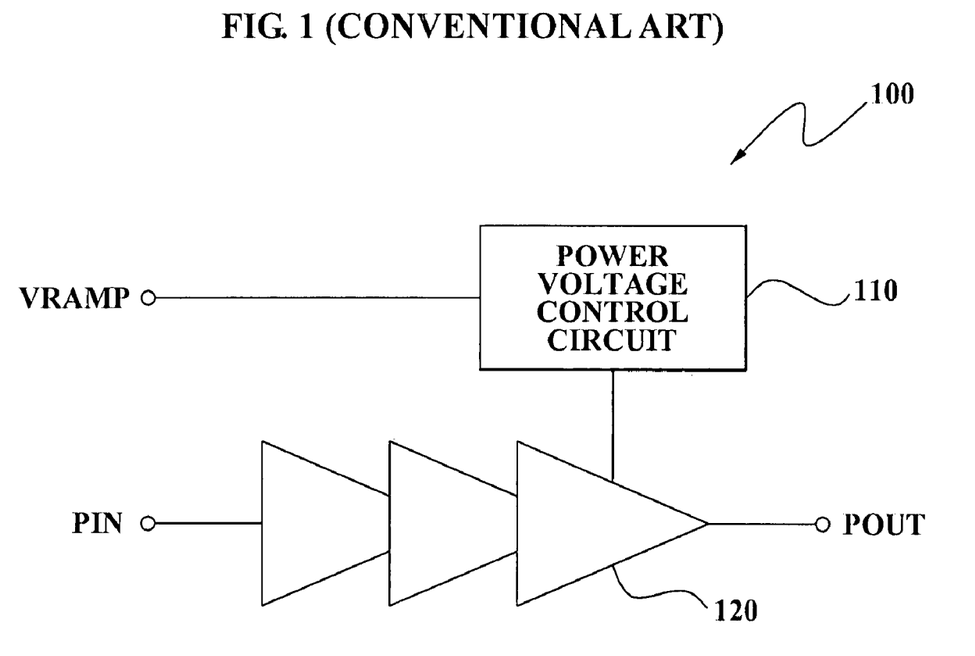
FIG. 1 is a diagram illustrating a structure of a conventional art power amplifier.

FIG. 1 illustrates a structure of a conventional art power amplifier 100. Referring to FIG. 1, the power amplifier 100 includes a power voltage control circuit 110 and an amplification stage 120.

An input signal PIN is a carrier signal in a high frequency domain for high speed wireless communication, and the input signal PIN is amplified by the amplification stage 120. The amplification stage 120 amplifies the input signal PIN using amplifiers in various stages. In this instance, the signal, amplified by the amplification stage 120, is mixed with an output of the power voltage control circuit 110, and the mixed signal is generated as an output signal POUT. The power voltage control circuit 110 receives and processes a predetermined signal VRAMP for specifying a voltage level of the output signal POUT, for envelope modulation of the amplified signal by the amplification stage 120.

The power voltage control circuit 110 amplifies the signal VRAMP having a predetermined envelope determined by modulation scheme, for example, QPSK modulation, QAM, and the like, or eliminates a noise component introduced into the signal VRAMP. Accordingly, the envelope modulation by the power voltage control circuit 110 is reflected to the output signal POUT, the output signal POUT is transmitted via an antenna.

A transistor is inserted to an end of the power voltage control circuit 110. Namely, the output signal POUT is generated by mixing a transistor output at the end of the power voltage control circuit 110 with the amplified signal by the amplification stage 120.

Figure 2:
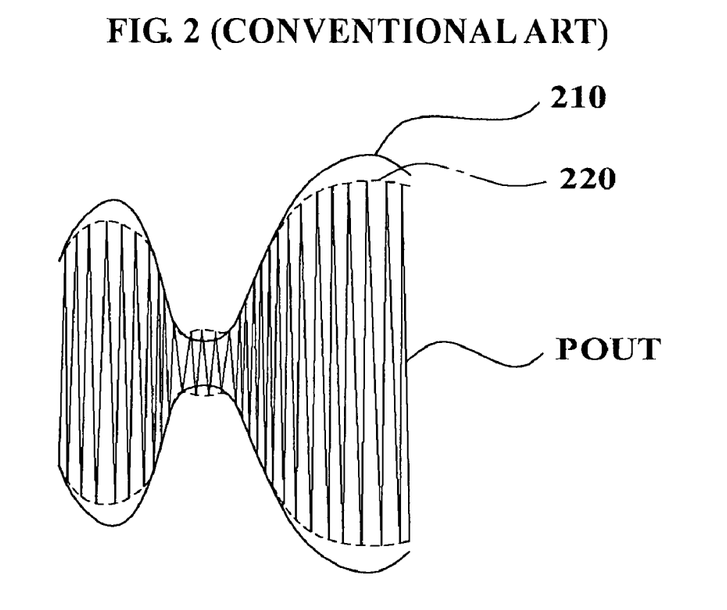
FIG. 2 is a diagram illustrating a distortion of envelope modulation of an output signal of the conventional art power amplifier.

As described above, since an active device at the end of the power voltage control circuit 110 is utilized for signal amplification, a power loss becomes great and a signal distortion occurs. Namely, in FIG. 2, when the signal distortion does not exist, the output signal POUT may be output in an envelope form shaped in a waveform 210. However, when the signal distortion does exist, as shown by waveform 220, the output signal POUT is distorted in ranges where a signal level is greater than a certain level and less than a certain level due to non-linearity of the active device. Also, since the active device has a comparatively greater resistance than a passive device, power consumption is greater than the passive device. Therefore, it is required to reduce the distortion of the output signal POUT and the power loss for generating the output signal POUT.

SUMMARY OF THE INVENTION

It is an aspect of the present invention to provide a power amplifier which can reduce power loss and reduce signal distortion since envelope modulation for a high frequency signal is performed by using a transformer, i.e. a passive device, in a transmitter of a wireless communication system.

It is also an aspect of the present invention to provide a power amplification method using a transformer, i.e. a passive device in a transmitter of a wireless communication system in order to reduce power loss and reduce signal distortion.

According to an aspect of the present invention, there is provided a power amplifier circuit including: a transformer receiving a first signal and generating a transformed signal from the first signal; and a transistor receiving a second signal having a direct current (DC) component, and generating an output signal corresponding to a mixture of the second signal and the transformed signal, via a terminal connected with the transformed signal, wherein an envelope of the output signal is controlled by the first signal.

According to another aspect of the present invention, there is provided a power amplifier circuit including: a first transformer receiving a first signal and generating a first transformed signal from the first signal; a first transistor receiving a second signal having a DC component, and generating a first output signal corresponding to a mixture of the second signal and the first transformed signal, via a terminal connected with the first transformed signal; a second transformer receiving a third signal and generating a second transformed signal from the third signal; and a second transistor receiving a fourth signal having the DC component, and generating a second output signal corresponding to a mixture of the fourth signal and the second transformed signal, via a terminal connected with the second transformed signal, wherein the power amplifier circuit generates a signal that the first output signal and the second output signal are mixed.

According to another aspect of the present invention, there is provided a power amplifier circuit including: a transformer receiving a pair of differential signals and generating a transformed signal from the pair of differential signals; and a transistor receiving a second signal having a DC component, and generating an output signal corresponding to a mixture of the second signal and the transformed signal, via a terminal connected with the transformed signal, wherein an envelope of the output signal is controlled by the differential signals.

According to another aspect of the present invention, there is provided a signal amplification method including: receiving a first signal to generate a transformed signal, in a transformer; receiving a second signal having a DC component, in a transistor; and generating an output signal corresponding to a mixture of the second signal and the transformed signal, via a terminal connected with the transformed signal, in the transistor, wherein an envelope of the output signal is controlled by the first signal.

According to another aspect of the present invention, there is provided a signal amplification method including: receiving a first signal to generate a first transformed signal, in a first transformer; receiving a second signal having a DC component, in a first transistor; generating a first output signal corresponding to a mixture of the second signal and the first transformed signal, via a terminal connected with the first transformed signal, in the first transistor; receiving a third signal to generate a second transformed signal, in a second transformer; receiving a fourth signal having the DC component, in a second transistor; generating a second output signal corresponding to a mixture of the fourth signal and the second transformed signal, via a terminal connected with the second transformed signal, in the second transistor; and generating a signal that the first output signal and the second output signal are mixed.

According to another aspect of the present invention, there is provided a signal amplification method including: receiving a first analog signal and a second analog signal that are a pair of analog differential signals; generating a first pulse width modulated signal from the first analog signal; generating a second pulse width modulated signal from the second analog signal; receiving the first pulse width modulated signal and the second pulse width modulated signal via a first coil of a transformer and generating a transformed signal from a second coil of the transformer; receiving a signal having a DC component, in a transistor; and generating an output signal corresponding to a mixture of the signal having the predetermined DC component and the transformed signal, via a terminal connected with the transformed signal, in the transistor, wherein an envelope of the output signal is controlled by the pair of analog differential signals.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF EXEMPLARY EMBODIMENTS

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 3:
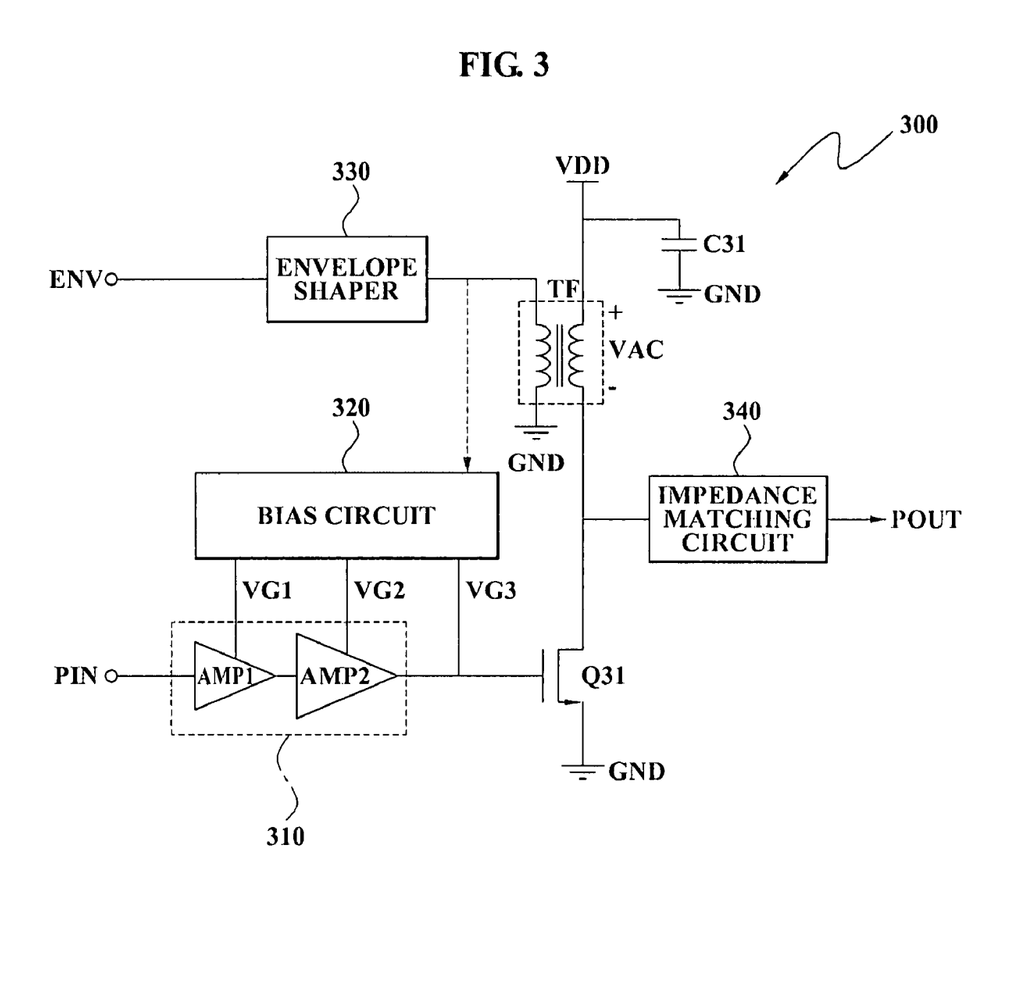
FIG. 3 is a diagram illustrating a power amplifier circuit according to an exemplary embodiment of the present invention.
Figure 4:
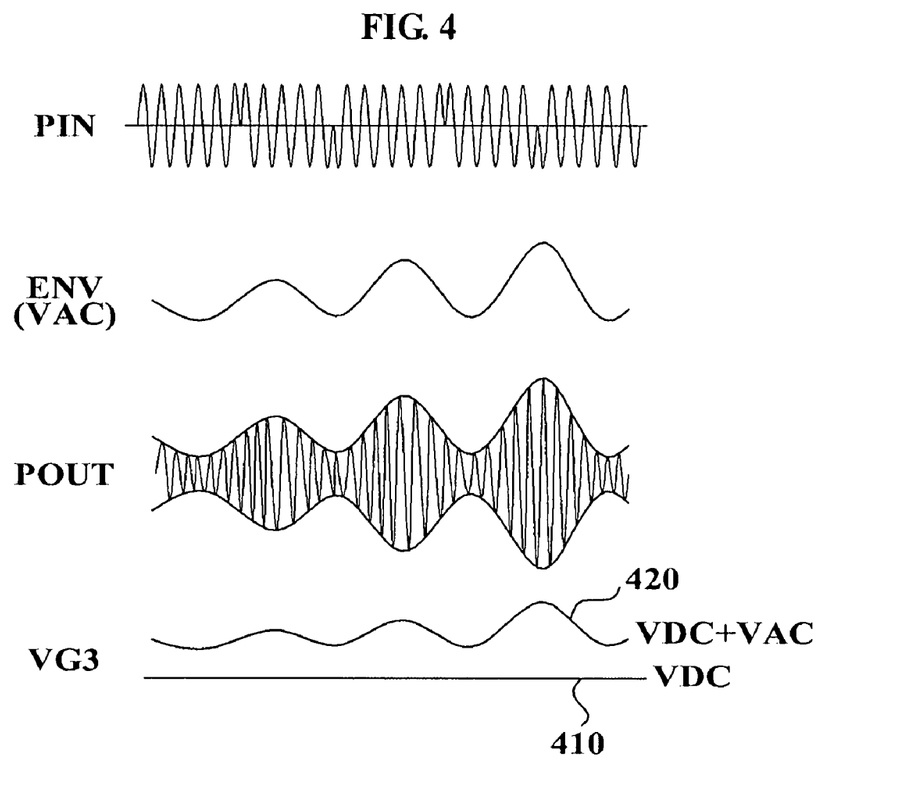
FIG. 4 is a diagram illustrating a signal waveform of the power amplifier circuit of FIG. 3 while in operation.

FIG. 3 is a diagram illustrating a power amplifier circuit 300 according to an exemplary embodiment of the present invention. Referring to FIG. 3, the power amplifier circuit 300 includes a driver stage 310, an amplification transistor Q31, a transformer TF, a bias circuit 320, an envelope shaper 330, an impedance matching circuit 340 and a capacitor C31. A signal waveform diagram illustrated in FIG. 4 is referred to, to explain operations of the power amplification circuit 300.

In the power amplification circuit 300 according to an exemplary embodiment of the present invention, envelope modulation is performed with respect to an input high frequency signal PIN by using the transformer TF, i.e. a passive device. Subsequently, a power loss caused by generating a power amplified signal POUT may be reduced and the power amplified signal POUT may be clearly outputted without distortion. The input high frequency signal PIN may be an analog signal which is phase-modulated according to a signal modulation scheme of a wireless communication system such as QPSK modulation, QAM modulation, and the like. The input high frequency PIN is a constant envelope signal as shown in FIG. 4.

The power amplification circuit 300 may be applied to a polar modulation transmitter of a ubiquitous system or a wireless communication system, for example, a code division multiple access (CDMA) system, a global positioning system (GPS), a personal communication system (PCS), an international mobile telecommunication (IMT) 2000 system, a wireless broadband Internet (Wibro) system, a wireless local area network (WLAN) system, an ultra wideband (UWB) system, or a world interoperability for microwave access (WiMax) system.

For the envelope modulation, an input envelope signal ENV is inputted to the envelope shaper 330. As illustrated in FIG. 4, the input envelope signal ENV is determined by a modulation scheme, for example, QPSK modulation, QAM modulation, and the like. The input envelope signal ENV is an analog signal having variable amplitude, not a constant envelope, and includes meaningful information to be transmitted with the input high frequency signal PIN in the transmitter. The envelope shaper 330 may eliminate a high frequency noise component by low pass filtering the input envelope signal ENV using a filter. Also, the envelope shaper 330 may amplify the input envelope signal ENV to control the amplitude using an amplifier.

An output signal of the envelope shaper 330, i.e. a signal generated by filtering and amplifying the input envelope signal ENV, is inputted to the transformer TF, while maintaining an envelope form of the input envelope signal ENV. The transformer TF transforms an input signal supplied to a first coil according to a turns ratio of the first coil and a second coil, and generates a transformed signal VAC in the second coil, i.e. the transformer TF generates the transformed signal VAC from an output signal of the envelope shaper 330.

In FIG. 3, two terminals of the first coil of the transformer TF respectively receive a first power source GND, for example, a ground, and an output signal of the envelope shaper 330. A first terminal of the second coil is connected with a second power VDD, for example, 5 volt, and a second terminal of the second coil generates the transformed signal VAC. For a stable supply of the second power VDD, a capacitor C31 having a predetermined capacitance is connected between the first power source GND and the second VDD.

The transistor Q31 may be an N channel metal-oxide semiconductor field effect transistor (MOSFET). However the transistor Q31 is not limited to the N channel MOSFET, and may be formed of a bipolar junction transistor or a heterojunction bipolar transistor.

A first terminal among a drain and a source of the transistor Q31, for example, the drain is connected with the transformed signal VAC generated by the transformer TF. A second terminal among a drain and a source of the transistor Q31, for example, the source is connected with the first power source GND. A gate of the transistor Q31 receives an added signal representing the sum of a direct current (DC) component VG3 generated from the bias circuit 320 and an output signal of the driver stage 310. Subsequently, the transistor Q31 outputs a signal via the first terminal among the drain and the source, for example, via the drain, in which the added signal and the transformed signal VAC are mixed. The signal of the drain is outputted as a power amplified signal POUT in FIG. 4 via the impedance matching circuit 340. The impedance matching circuit 340 change an antenna impedance, for example, 50 ohm into an impedance level required for the drain of the transistor Q31. The impedance matching circuit 340 may include a resistance, a capacitor, inductor and the like.

As described above, the transistor Q31 receives an added signal representing the sum of the direct current (DC) component VG3 generated from the bias circuit 320 and the output signal of the driver stage 310. The transistor Q31 generates a signal in which the added signal and the transformed signal are mixed, via a terminal connected with one terminal of the second coil of the transformer TF, for example, via the drain. In this instance, a signal of the drain of the transistor Q31 or an envelope of the power amplified signal POUT is controlled by the envelope signal ENV.

The bias circuit 320 generates DC components VG1 and VG2 for supplying to the driver stage 310, in addition to the DC component VG3 for supplying to the transistor Q31, from a predetermined power source. The driver stage 310 generates a signal that amplified the input high frequency signal PIN using at least one amplifier AMP1 or AMP2 biased by the DC components VG1 and VG2. The output signal of the driver stage 310, i.e. the amplified signal of the input high frequency signal PIN is added to the DC component VG3, and the added signal is outputted to the gate of the transistor Q31.

As described above, in the power amplification circuit 300 according to an exemplary embodiment of the present invention, a resistance is less and linearity is higher than an active device using a conventional art by utilizing the transformer TF, i.e. the passive device. Therefore, a power loss caused by generating the power amplified signal POUT may be reduced, and the power amplified signal POUT may be clearly outputted without distortion.

Figure 5:
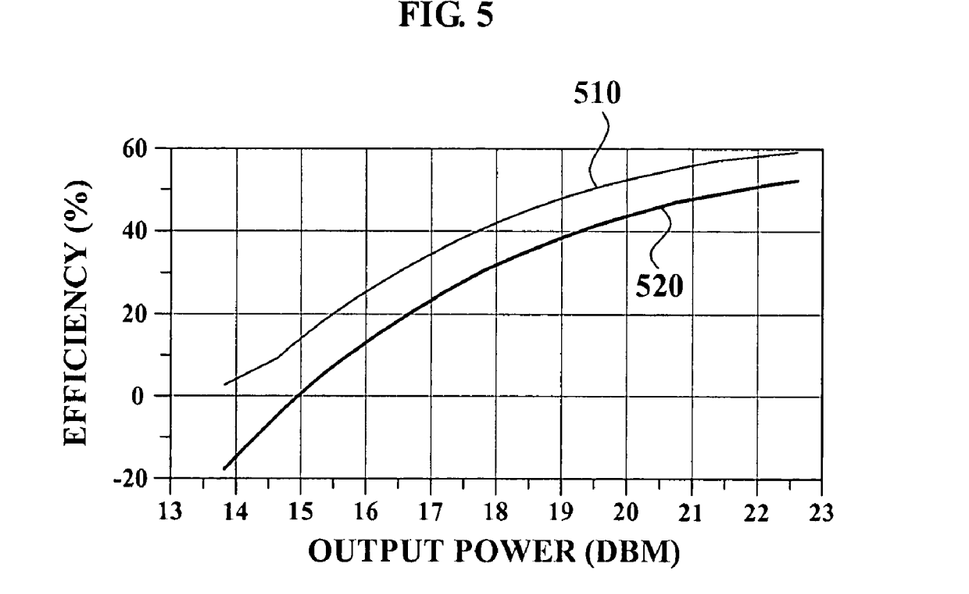
FIG. 5 is a diagram illustrating a graph of efficiency with respect to an output power of the power amplifier circuit of FIG. 3.

FIG. 5 is a diagram illustrating a graph of efficiency with respect to an output power of the power amplifier circuit 300 of FIG. 3. In FIG. 5, a curve 510 indicates power efficiency with respect to an output power of the circuit 300 of FIG. 3 according an exemplary embodiment to the present invention, and a curve 520 indicates power efficiency of the conventional art as illustrated in FIG. 1. As illustrated in FIG. 5, the power amplification circuit 300 of FIG. 3 is improved over the conventional art in terms of the power efficiency by at least 10 percent.

Also, in order to improve performance of the power amplification circuit 300 of FIG. 3, the bias circuit 320 of FIG. 3 may include a second transformer (not shown) performing identical operations as the transformer TF. As an example, as described in FIG. 3, the second transformer receives an output signal of the envelope shaper 330 and generates a second transformed signal having a similar waveform to the transformed signal VAC. The second transformer may be formed between the DC component generated from the bias circuit 320 of FIG. 3 and the gate of the transistor Q31 of FIG. 3. Therefore, as illustrated in FIG. 4, a waveform 420 that the DC component value, for example, Vdc, and the second transformed signal are added with each other, i.e. 'VDC+VAC', may be added to the gate of the transistor Q31. In this instance, the output signal of the driver stage 310 of FIG. 3 is also added to the gate of the transistor Q31; therefore, a signal which the second transformed signal and a signal that is an addition of the output signal of the driver stage 310 and the DC component value Vdc are mixed, is supplied to the gate of the transistor Q31. In FIG. 3, only the DC component value Vdc 410 is added to the output signal of the driver stage 310 and the added signal is supplied to the gate of the transistor Q31, however, from the second transformer, the second transformed signal is additionally mixed with the output signal of the driver stage 310 and the mixed signal is supplied to the gate of the transistor Q31, consequently more accurate envelope modulation operation and a performance of the power amplification circuit 300 having improved power efficiency, may be expected.

Figure 6:
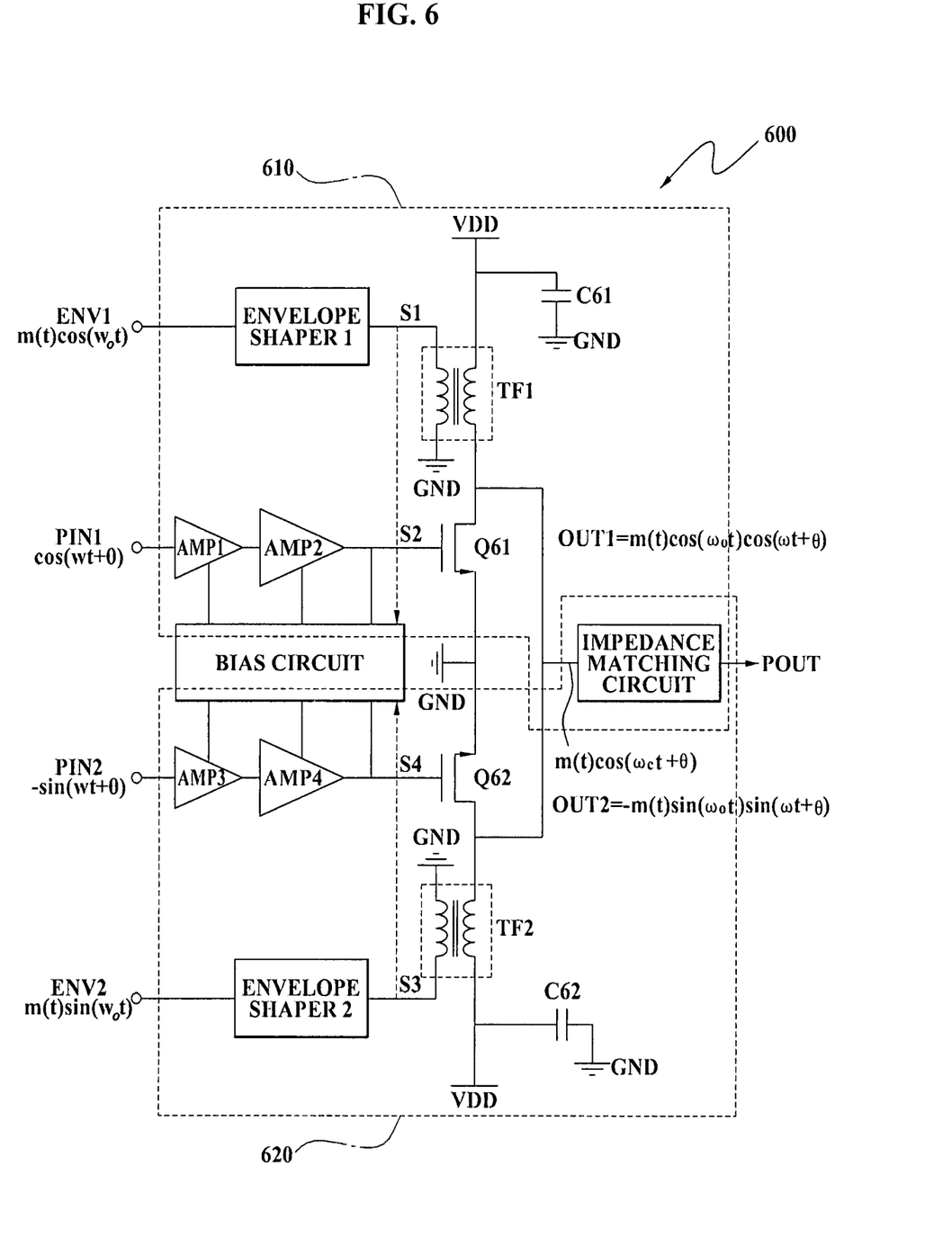
FIG. 6 is a diagram illustrating a power amplifier circuit according to another exemplary embodiment of the present invention.

FIG. 6 is a diagram illustrating a power amplifier circuit 600 according to another exemplary embodiment of the present invention. Referring to FIG. 6, the power amplification circuit 600 includes a first amplifier circuit 610 and a second amplifier circuit 620.

The first amplifier circuit 610 and the second amplifier circuit 620 are respectively formed in similar configurations as the power amplifier circuit 300 of FIG. 3, and perform similar operations as the power amplifier circuit 300 of FIG. 3. However, after an output signal OUT1 of the first amplifier circuit 610 and an output signal OUT2 of the second amplifier circuit 620 are mixed, and a power amplified signal POUT is generated.

An envelope signal $ENV1=m(t)\cos(w_0 t)$ and an input high frequency signal $PIN1=\cos(wt+\theta)$ are inputted to the first amplifier circuit 610. An envelope signal $ENV2=m(t)\sin(w_0 t)$ and an input high frequency signal $PIN2=-\sin(wt+\theta)$ are inputted to the second amplifier circuit 620. In this instance, the m(t) indicates an amplitude determination signal, the w and the $w_0$ indicate frequencies, and the $\theta$ indicates a phase. As described above, a phase difference between the envelope signals ENV1 and the ENV2 is 90 degrees, and a phase difference between the input high frequency signals PIN1 and PIN2 is 270 degrees.

Figure 7:
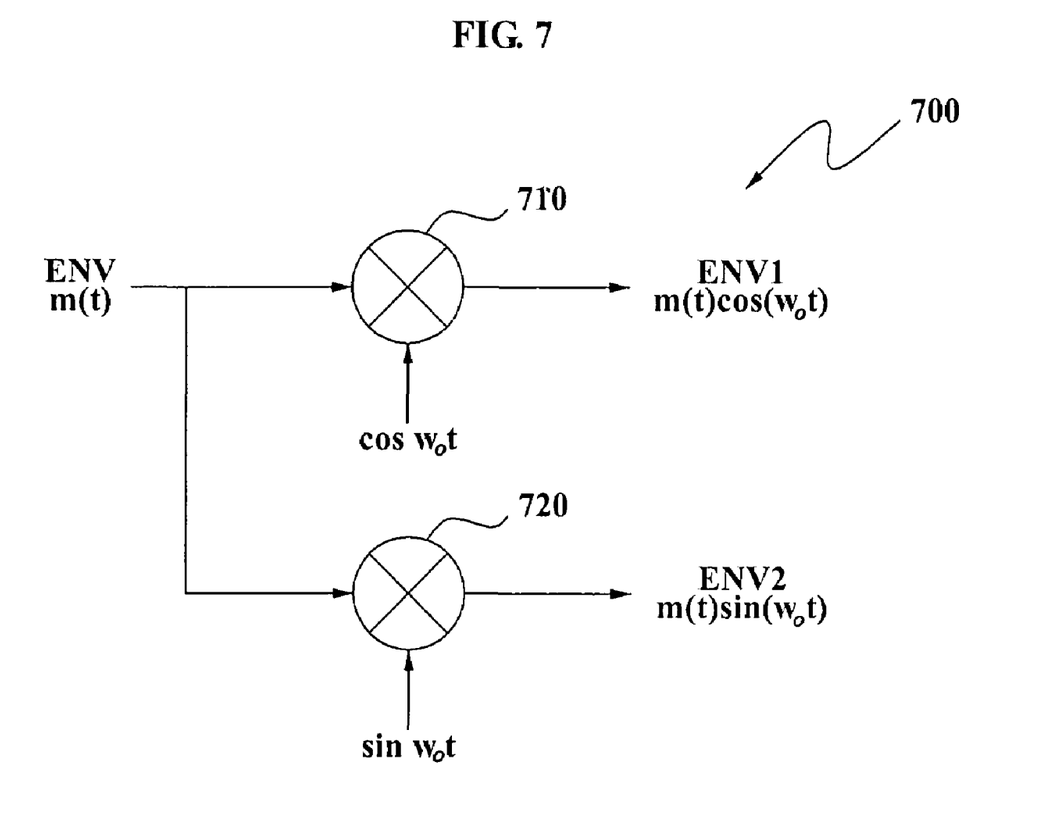
FIG. 7 is a diagram illustrating generation of input envelope signals of the power amplifier circuit of FIG. 6.

The envelope signals ENV1 and ENV2 may be generated by using two mixers 710 and 720 as illustrated in FIG. 7. Specifically, the first mixer 710 mixes two signals m(t) and the $\cos(w_0 t)$ and generates the envelope signal ENV1. Also, the second mixer 720 mixes two signals m(t) and the $\sin(w_0 t)$ and generates the envelope signal ENV2.

Accordingly, a phase difference between a first signal S1 inputted to the first transformer TF1 of the first amplifier circuit 610 of FIG. 6 and a third signal S3 inputted to the second transformer TF2 of the second amplifier circuit 620 of FIG. 6 is 90 degrees, a phase difference between a second signal S2 having a DC component inputted to the first transistor Q61 of the first amplifier circuit 610 and a fourth signal S4 having the DC component inputted to the second transistor Q62 of the second amplifier circuit 620, is 270 degrees.

Consequently, the first transformer TF1 receives the first signal S1 to generate a first transformed signal. The first transistor Q61 receives the second signal S2, generates a first output signal OUT1 corresponding to a mixture of the second signal S2 and the first transformed signal, via one terminal connected with the first transformed signal.

Also, the second transformer TF2 receives the third signal S3 to generate a second transformed signal. The second transistor Q62 receives the fourth signal S4, and generates a second output signal OUT2 corresponding to a mixture of the fourth signal S4 and the second transformed signal, via the one terminal connected with the second transformed signal.

The first output signal terminal is connected with the second output signal terminal, and a signal that is a mixture of the first output signal OUT1 and the second output signal OUT2 is generated from a connected contact point. Specifically, the first output signal OUT1 is represented by $m(t)\cos(w_0 t)*\cos(wt+\theta)$, and the second output signal OUT2 is represented by $-m(t)\sin(w_0 t)*\sin(wt+\theta)$. The first output signal OUT1 and the second output signal OUT2 are added via a predetermined coupling circuit before an impedance matching circuit, and the added result is represented by $m(t)\cos(w_0 t)\cos(wt+\theta)-m(t)\sin(w_0 t)\sin(wt+\theta)=m(t)\cos(w_c t+\theta)$, which is desirably envelope-modulated and phase-shifted. In this instance, $w_c$ is equal to $w+w_o$, $w$ and $w_o$ are calculated beforehand, and the mixed signal is outputted as a power amplified signal POUT via the impedance matching circuit.

The power amplifier circuit 600 having a differential envelope modulation structure modulates the envelope signal including the DC component into a predetermined frequency, for example, $w_o$, and transmits the envelope signal to the transformer, so that the envelope signal may pass through the transformer without omission of the DC component. Accordingly, when an amplifier circuit is required, existence of the DC component included to the envelope is significant, and the power amplifier circuit 600 may be usefully utilized.

Namely, the first output signal OUT1 is represented by Equation 1 below, $$OUT1 = m(t)\cos(w_0 t)\cos(wt+\theta) \quad \text{[Equation 1]}$$
$$= \frac{1}{2}m(t)\cos|(w+w_0)t+\theta| +$$
$$\frac{1}{2}m(t)\cos|(w-w_0)t+\theta|$$

The second output signal OUT2 is represented by Equation 2 below, $$OUT2 = -m(t)\sin(w_0 t)\sin(wt+\theta) \quad \text{[Equation 2]}$$
$$= \frac{1}{2}m(t)\cos|(w+w_0)t+\theta| -$$
$$\frac{1}{2}m(t)\cos|(w-w_0)t+\theta|$$

Accordingly, when the first output signal OUT1 and the second output signal OUT2 are added, a partial component of the first output signal OUT1 and a partial component of the second output signal OUT2 are eliminated with each other, the power amplified signal POUT becomes POUT=$m(t)\cos(w_c t+\theta)$, and therefore a desirable output signal may be generated.

In addition to this, since a carrier frequency $w_c$ of the power amplified signal POUT is represented by $w_c=w+w_o$, a frequency w of the input high frequency signals PIN1 and PIN2 may become less than the input signal PIN of the power amplifier circuit 300 of FIG. 3 by $w_o$.

As described above, as the frequency becomes less, a design for the power amplifier circuit 600 or a preceding circuit of the power amplifier circuit 600 may become simpler.

As illustrated in FIG. 6, in order to improve a performance of the power amplifier circuit 600, amplifiers AMP1, AMP2, AMP3 and AMP4 of a driver stage of first amplifier circuit 610 and second amplifier circuit 620 and a bias circuit supplying transistors Q61 and Q62 with the DC component may include a third transformer TF3 (not shown) performing identical operations as the first transformer TF1, and a fourth transformer TF4 (not shown) performing identical operations as the second transformer TF2.

The third and fourth transformers TF3 and TF4 may be respectively formed between the DC component generated from the bias circuit and a gate of the first and second transistors Q61 and Q62 of FIG. 6. The third transformer TF3 receives the first signal S1 and generates a third transformed signal. The fourth transformer TF4 receives the third signal S3 and generates a fourth transformed signal.

Subsequently, the input high frequency signal PIN1 is amplified in the amplifiers AMP1 and AMP2 of the amplifier circuit 610 of FIG. 6, the amplified signal is added to the DC component generated from the bias circuit of FIG. 6, the added signal is mixed with the third transformed signal of the third transformer TF3 (not shown), and consequently the mixed signal may be supplied to the gate of the transistor Q61 of FIG. 6. Also, the input high frequency signal PIN2 is amplified in the amplifiers AMP3 and AMP4 of the amplifier circuit 620 of FIG. 6, the amplified signal is added to the DC component generated from the bias circuit of FIG. 6, the added signal is mixed with the fourth transformed signal of the fourth transformer TF4 (not shown), and consequently the mixed signal may be supplied to the gate of the transistor Q62 of FIG. 6.

Figure 8:
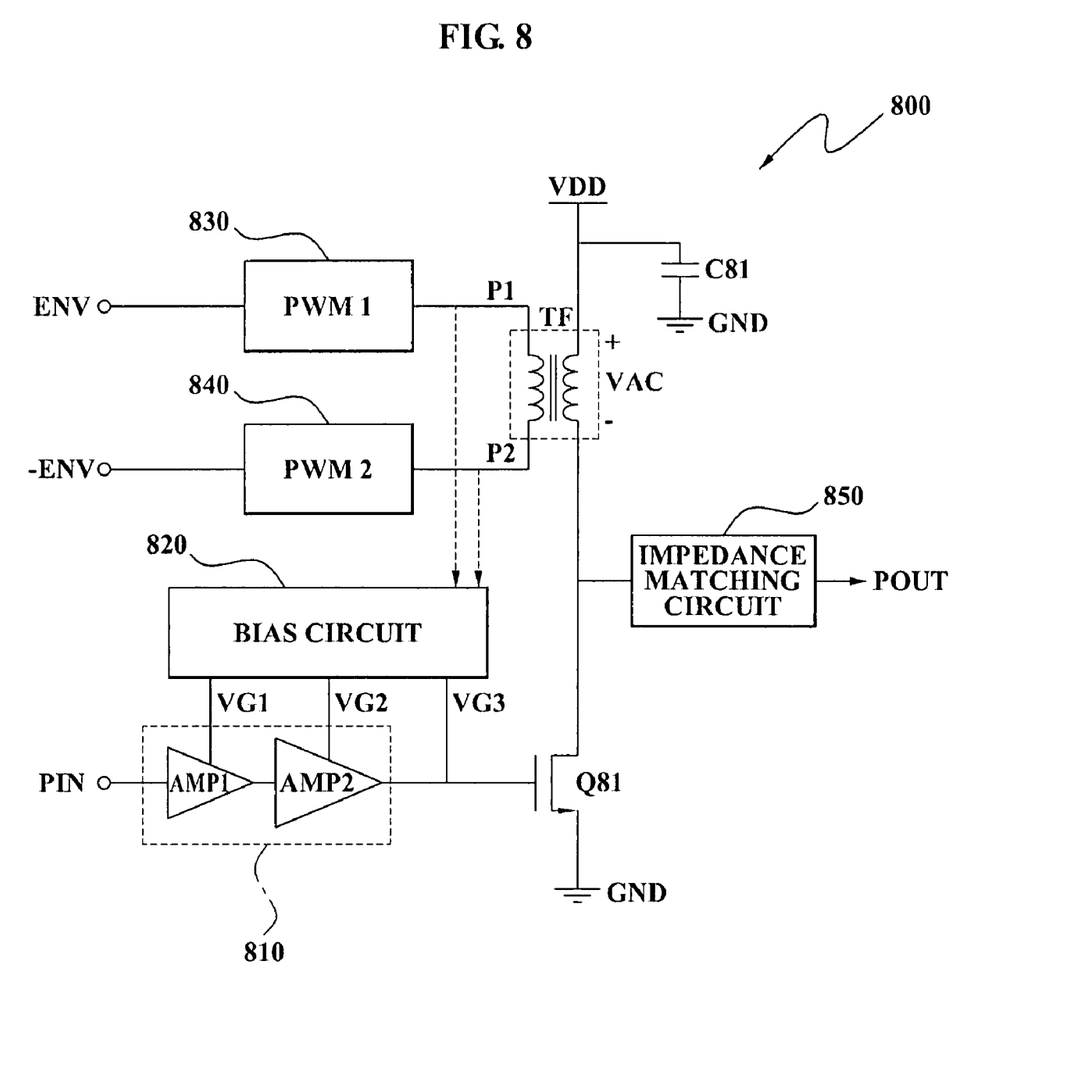
FIG. 8 is a diagram illustrating a power amplifier circuit according to yet another exemplary embodiment of the present invention.
Figure 9:
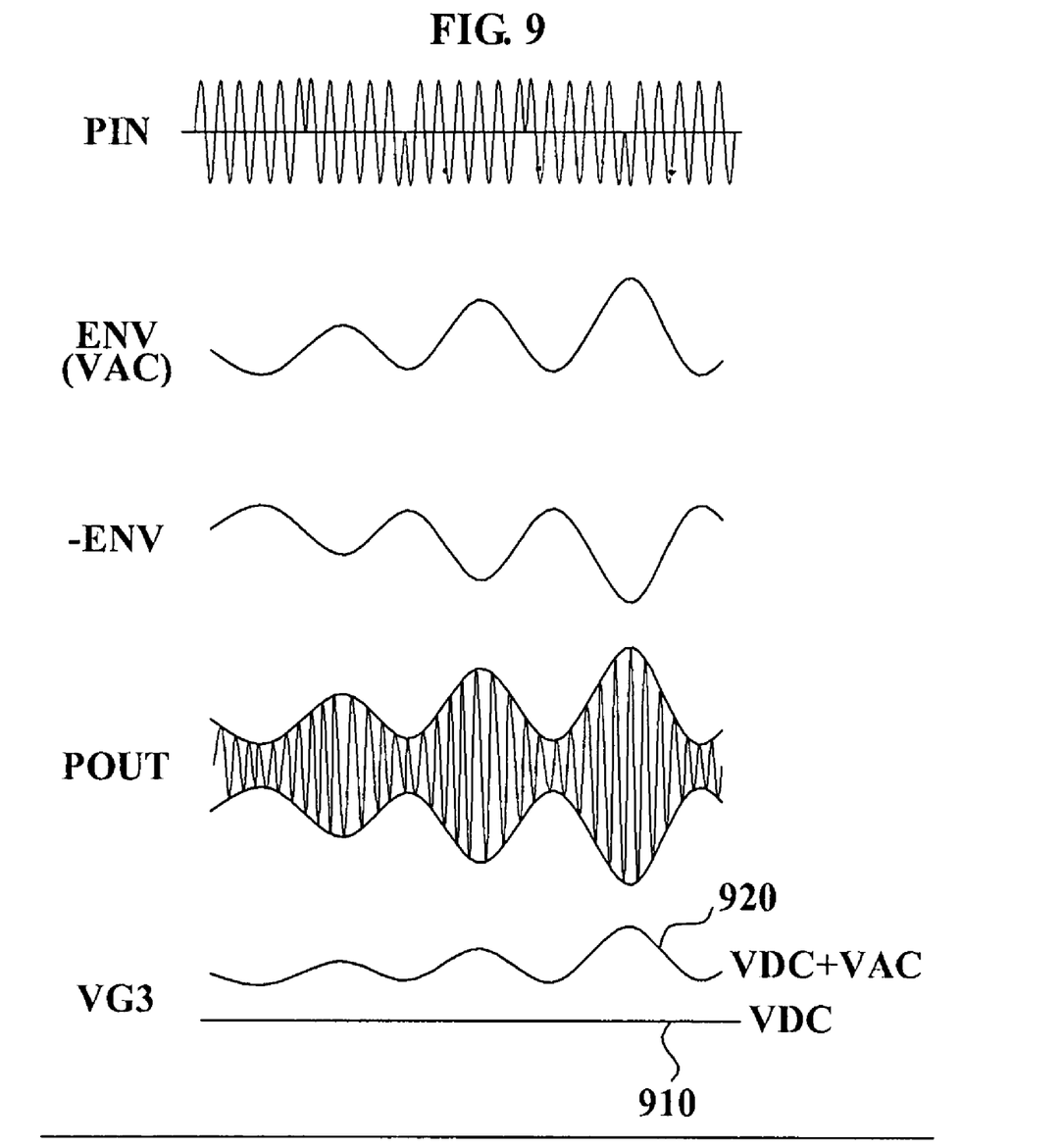
FIG. 9 is a diagram illustrating a signal waveform of the power amplifier circuit of FIG. 8 while in operation.

FIG. 8 is a diagram illustrating a power amplifier circuit 800 according to yet another exemplary embodiment of the present invention. Referring to FIG. 8, the power amplifier circuit 800 includes a driver stage 810, a power amplification transistor Q81, a transistor TF, a bias circuit 820, a first pulse width modulator (PWM) 830, a second PWM 840, an impedance matching circuit 850, and a capacitor C81. A signal waveform diagram of FIG. 9 is referred to, to describe operations of the power amplifier circuit 800.

The power amplifier circuit 800 operates similar to the power amplifier circuit 300 of FIG. 3. Namely, the driver stage 810, the power amplification transistor Q81, the transformer TF, the bias circuit 820, the impedance matching circuit 850, and the capacitor C81 of FIG. 8 operate similar to the driver stage 310, the power amplification transistor Q31, the transformer TF, the bias circuit 320, the impedance matching circuit 340 and the capacitor C31 of FIG. 3, respectively. However, the first PWM 830 and the second PWM 840 are utilized instead of the envelope shaper 330.

In FIG. 8, a pair of analog differential signals ENV and −ENV are utilized for envelope signals. The differential signals ENV and −ENV have a 180 degree phase difference from each other. The first PWM 830 generates a first pulse width modulated signal P1 from a first analog signal ENV of the pair of analog differential signals. The second PWM 840 generates a second pulse width modulated signal P2 from a second analog signal −ENV of the pair of analog differential signals. In this instance, the pulse width modulations may be performed via various methods comparing a predetermined reference signal to an input signal. Since the signals ENV and −ENV are differential signals, the first pulse width modulated signal P1 and the second pulse width modulated signal P2 may be generated as differential signals having a 180 degree phase difference from each other.

As described above, the generated differential pulse width modulated signals P1 and P2 are inputted to two terminals of a first coil of the transformer TF. A first terminal of a second coil of the transformer TF is connected with a second power source VDD, a second terminal of the second coil generates a transformed signal VAC.

Subsequently, the transistor Q81 receives an added signal representing the sum of an amplification signal of an input high frequency signal PIN and a predetermined DC component, via a gate, according to operations of the driver stage 810 and the bias circuit 820. The transistor Q81 generates an output signal in which a signal of the gate and the transformed signal VAC are mixed with each other, via a terminal which is connected with the transformed signal VAC generated from the transformer TF, for example, via a drain. The output signal of the drain of the transistor Q81 is outputted as a power amplified signal POUT, via an impedance matching circuit 850.

In FIG. 8, the output signal of the transistor Q81 or the power amplified signal POUT is controlled according to a pair of the differential signals ENV and −ENV. Particularly, as described in FIG. 6, the power amplifier circuit 800 allows the envelope of the power amplified signal POUT to pass through without omission of the DC component from the envelope. Subsequently, the circuit may be usefully utilized for a system in which a DC component should not be eliminated from the envelope. Namely, when the differential pulse width modulated signals P1 and P2 are inputted to the transformer TF, and when the transformed signal VAC is generated, since opposite-phase signals are mixed with the DC component included in the pair of differential signals ENV and −ENV, the differential pulse width modulated signals P1 and P2 may be outputted to a terminal of the drain of the power amplification transistor Q81 without omission of the DC component. In the power amplifier circuit 800 of the present invention, a size of a circuit may be reduced since mixers 710 and 720 of FIG. 7 or a pair of amplifier circuits for generating the envelope signals ENV1 and ENV2 required in FIG. 6, is not required.

As described in FIGS. 3 and 6, in order to improve a performance of the power amplifier circuit 800, the bias circuit 820 supplying amplifiers AMP1 and AMP2, and the transistor Q81 of the driver stage 810 with the DC component may include a second transformer TF2 (not shown) performing a substantially identical operation as the transformer TF.

The second transformer TF2 (not shown) may be formed between the DC component generated from the bias circuit 820 and the gate of the transistor Q81. The second transformer TF2 (not shown) receives the differential pulse width signals P1 and P2 and generates a second transformed signal.

Subsequently, as a waveform 920 illustrated in FIG. 9, the input high frequency signal PIN is amplified in the amplifiers AMP1 and AMP2 of the driver stage 810 of FIG. 8, the amplified signal is added to the DC component generated from the bias circuit 820 of FIG. 8, the added signal is mixed with the second transformed signal of the second transformer TF2 (not shown), and consequently the mixed signal may be supplied to the gate of the transistor Q81 of FIG. 8. In this instance, the power amplifier circuit 800 of FIG. 8 may be more precisely envelope modulated, and power efficiency may be comparatively improved over a case of only a DC component value Vdc 910 being added to an output signal of the driver stage 810 of FIG. 8 and being supplied to the gate of the transistor Q81.

As described above, in the power amplifier and the signal amplification method according to the exemplary embodiments of the present invention, envelope modulation for a high frequency signal is performed and a power amplified signal is generated by using a transformer whose resistance is comparatively less and linearity is higher than an active device; therefore, a power loss and a signal distortion may be reduced. Accordingly, power amplifier according to the exemplary embodiments of the present invention may be applied to systems for high speed wireless communication, for example, a mobile phone, a digital multimedia broadcasting (DMB) phone, a personal digital assistance (PDA) or a transmitter of a ubiquitous system, to improve a performance of the systems.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A power amplifier circuit comprising:
   a transformer which receives a first signal and generates a transformed signal from the first signal; and
   a transistor which receives a second signal having a direct current (DC) component, and generates an output signal corresponding to a mixture of the second signal and the transformed signal, via a terminal connected with the transformed signal,
   wherein an envelope of the output signal is controlled by the first signal.

2. The power amplifier circuit of claim 1, wherein, two terminals of a first coil of the transformer respectively receive a first power source and the first signal, a first terminal of a second coil of the transformer is connected with a second power source, and a second terminal of the second coil generates the transformed signal.

3. The power amplifier circuit of claim 2, wherein, a gate of the transistor receives the second signal, a first terminal among a drain and a source of the transistor is connected with the transformed signal, a second terminal among the drain and the source is connected with the first power source, and the first terminal generates the output signal.

4. The power amplifier circuit of claim 1, further comprising:
   an envelope shaper which generates the first signal by low pass filtering and amplifying an input analog signal.

5. The power amplifier circuit of claim 1, further comprising:
   a bias circuit which generates at least one DC component from a power source; and
   a driver stage which generates the second signal from an input analog signal using at least one amplifier biased by the at least one DC component.

6. The power amplifier circuit of claim 5, wherein the bias circuit comprises:
   a second transformer which receives the first signal and generates a second transformed signal from the first signal,
   wherein the second signal corresponds to a mixture of the second transformed signal and an analog signal having the DC component.

7. The power amplifier circuit of claim 1, further comprising:
   an impedance matching circuit connected with the output signal.

8. A signal amplification method comprising:
   receiving a first signal to generate a transformed signal, by a transformer;
   receiving a second signal having a DC component, by a transistor; and
   generating an output signal corresponding to a mixture of the second signal and the transformed signal, via a terminal connected with the transformed signal, by the transistor,
   wherein an envelope of the output signal is controlled by the first signal.

* * * * *